(12) United States Patent
Helbig et al.

(10) Patent No.: US 9,207,132 B2
(45) Date of Patent: Dec. 8, 2015

(54) STRESS MEASUREMENT SENSOR

(71) Applicants: Pro-Micron GmbH & Co., Kaufbeuren (DE); Horst Siedle GmbH & Co. KG, Furtwangen (DE)

(72) Inventors: Christian Helbig, Ruderatshofen (DE); Sebastian Lotz, Rieden-Zellerberg (DE)

(73) Assignees: Pro-micron GmbH & Co. KG, Kaufbeuren (DE); Horst Siedle GmbH & Co. KG, Furtwangen (DE)

( * ) Notice: Subject to any disclaimer, the term of this patent is extended or adjusted under 35 U.S.C. 154(b) by 0 days.

(21) Appl. No.: 14/245,335

(22) Filed: Apr. 4, 2014

(65) Prior Publication Data

US 2014/0360281 A1    Dec. 11, 2014

(30) Foreign Application Priority Data

Apr. 8, 2013  (DE) .................. 10 2013 103 494

(51) Int. Cl.
| | |
|---|---|
| G01B 7/16 | (2006.01) |
| G01L 1/16 | (2006.01) |
| G01B 7/00 | (2006.01) |
| H03H 3/02 | (2006.01) |
| G01L 9/00 | (2006.01) |

(52) U.S. Cl.
CPC . *G01L 1/165* (2013.01); *G01B 7/00* (2013.01); *H03H 3/02* (2013.01); *G01L 9/0042* (2013.01); *H03H 2003/028* (2013.01); *Y10T 29/42* (2015.01)

(58) Field of Classification Search
CPC ......... G01L 1/165; G01L 9/0042; G01B 7/00
USPC ............................. 73/760, 778, 801
See application file for complete search history.

(56) References Cited

U.S. PATENT DOCUMENTS

| | | | |
|---|---|---|---|
| 4,213,104 A | 7/1980 | Cullen et al. | |
| 4,216,401 A | 8/1980 | Wagner | |
| 4,296,347 A | 10/1981 | Weirauch | |
| 5,345,201 A | 9/1994 | Greer et al. | |
| 6,231,516 B1* | 5/2001 | Keilman et al. | 600/485 |
| 6,982,475 B1* | 1/2006 | MacIntyre | 257/620 |
| 2006/0151203 A1* | 7/2006 | Krueger et al. | 174/260 |
| 2009/0127697 A1* | 5/2009 | Pahl | 257/698 |
| 2010/0109105 A1* | 5/2010 | Pinter | 257/419 |
| 2012/0313231 A1* | 12/2012 | Lim et al. | 257/676 |
| 2014/0103465 A1* | 4/2014 | Johnson et al. | 257/416 |

FOREIGN PATENT DOCUMENTS

EP    2056085    5/2009

\* cited by examiner

*Primary Examiner* — Max Noori
(74) *Attorney, Agent, or Firm* — Sand & Sebolt

(57) ABSTRACT

A stress measurement sensor provided with a sensor element that operates according to the SAW principle, comprising a base composed of a first material and the sensor element, which is fixed to the base with a joining material, is to be developed such that it can also be used at higher temperatures and has improved measurement properties. In addition, it is suggested that the joining material be a glass solder.

15 Claims, 2 Drawing Sheets

STRESS MEASUREMENT SENSOR

BACKGROUND OF THE INVENTION

1. Technical Field

The invention relates to a stress measurement sensor, which has a sensor element that operates according to the SAW principle, which is connected to a base by means of a joining material.

2. Background Information

A sensor element that operates according to the SAW principle, which is a component of a generic stress measurement sensor, refers to surface acoustic waves, abbreviated as SAW, and the sensor element thereof, which utilizes running characteristics that are dependent on external influences. Such sensor elements typically comprise a piezoelectrically active carrier crystal, on which patterns have been applied to a sensor surface, such, as in particular, transducer patterns and acoustic reflectors. Surface acoustic waves are created on the sensor surface by means of the electrical excitation of the carrier crystal, which propagate across this sensor surface at a propagation velocity. Stress sensors having such sensor elements, which operate according to the SAW principle, are formed by exploiting the effect that travel times of the surface acoustic waves between structures that are disposed on the surface of the sensor element are a function of mechanical stresses (deformations) exerted on the sensor element, a relation between the degree of corresponding stresses and a change in the propagation velocity of the surface acoustic waves may be produced as a function of said relation, and a degree of mechanical stress, or deformation, respectively, exerted thereon may thereby be extrapolated by determining the travel times, or changes thereto, respectively.

Such sensor elements that operate according to the SAW principle, as well as stress measurement sensors that are equipped with such sensor elements, are used everywhere where measurements must be taken at high temperatures or other extreme environmental conditions, or where a connection of the sensors by means of cabling is not possible or very difficult. This is because, on the one hand, sensor elements that operate according to the SAW principle are very resistant to high temperatures or other extreme environmental influences such as radiation or strong electrostatic fields for example. On the other hand, scanning may be done wirelessly, which greatly simplifies the transmission of measurement data from measurement points that are difficult to access.

The base of the stress measurement sensor is thereby frequently a separate element that is independent of the object that is to be measured, which serves as a foundation, or support, respectively, of the entire stress measurement sensor built thereon, and by means of which the stress measurement sensor may then be bound to an object that is to be measured, or fixed thereto, respectively. It is also possible, however, that the base of the stress measurement sensor itself is comprised of the same material as the object that is to be detected by means of measurement technology, in other words, that the object that is to be measured, or monitored by means of measurement technology, respectively, itself forms this base, or a section of this base, respectively, and the sensor element is applied directly to the object and fixed there through the use of the joining material. This type of application is the exception in current use.

As a rule, currently known stress measurement sensors, which are provided with sensor elements that operate according to the SAW principle, use a resin-based or other organic adhesive such as an epoxy resin for example, as a joining material between the sensor element and the base. Various shortcomings have been established in using this joining material. Thus, various chemical substances are produced even after a long period of time by the outgassing of such resin-based adhesives, for example solvents and the like contained therein, which condense on the sensor surface of the sensor element operating according to the SAW principle. However, the bonding of such foreign substances on the sensor surface, in turn, leads to a change in the running characteristics of the surface acoustic waves, thereby falsifying, or modifying, respectively, the measurement result of the sensor, and leads to measuring errors. In addition, resin-based compounds do not extend into the temperature ranges required for the use of appropriate stress measurement sensors in certain cases in terms of their temperature resistance, which may include use at 400° C. or more. In addition, resin-based, and other, organic adhesive compounds of the known type tend to age, so that the reliable service life of a stress measurement sensor formed with such a joining material is temporally limited.

A further known problem associated with a resin-based or organic joining agent is so-called "creep". For the sensor, the result of this effect is that a stress that is exerted over an extended period of time is eventually dissipated in the joining agent, in that the joining agent expands, so that the measured value of the sensor element erroneously drifts to the value of the relaxed state under these circumstances. If a sensor designed in this manner is again released after such a prolonged stressed state, the expansion of the joining agent, which is now imprinted, thus in turn leads to a stress exerted on the sensor element, which stress is caused solely by the joining agent, although no external mechanical stress is being applied. In this state, the sensor value indicates an amount of tension, which erroneously is not equal to zero. This behavior is known as hysteresis.

Finally, in the case of known joining methods, there is frequently a problem that a portion of the stresses, or deformations, respectively, exerted on the base are not transferred into the sensor element, but instead are cushioned by a deformation of the layer of joining material, since that material is not hard enough. This also leads to a measurement error in the known stress measurement sensors, or at least to a greatly reduced stress sensitivity of the sensor, as compared to sensors having harder joining materials.

SUMMARY

The object of the invention is to remedy this situation, and to further develop stress measurement sensors as described above, such that those sensors no longer exhibit the disadvantages described above.

This object is achieved according to the invention in that the joining material is a glass solder. Accordingly, a stress measurement sensor is provided with a sensor element that operates according to the SAW principle, comprising a base composed of a first material, and the sensor element, which is fixed to the base with a joining material and which sensor element is characterized in that the joining material is a glass solder. Advantageous further embodiments of a stress measurement sensor according to the invention include a stress measurement sensor in which the material combination comprising the material of the base, the glass solder and a carrier crystal of the sensor element is selected in such a way that the following relations apply to the thermal expansion coefficients of the materials involved, namely the thermal expansion coefficient of the material of the base (2) $CTE_{base}$, the thermal expansion coefficient of the glass solder $CTE_{glass\ solder}$ and the thermal expansion coefficients of the carrier crystal of the sensor element (3) that operates according to the SAW principle $CTE_{SAW}$:

i.   $CTE_{SAW}-3 \leq CTE_{base} \leq CTE_{SAW}+7$, ii.   $CTE_{glass\ solder} \leq CTE_{base}-2$, wherein the unit for the values for the thermal expansion coefficients is given in ppm/K.

In the stress measurement sensor a the following relation applies to the thermal expansion coefficients of the material of the base and the thermal expansion coefficients of the carrier crystal of the sensor element that operates according to the SAW principle (3) $CTE_{SAW}$:

i.   $CTE_{SAW}-1 \leq CTE_{base} \leq CTE_{SAW}+5$, wherein the unit for the values for the thermal expansion coefficients is given in ppm/K.

Furthermore, in the stress measurement sensor the following relation applies to the thermal expansion coefficients of the material of the base, $CTE_{base}$, and the thermal expansion coefficients of the glass solder, $CTE_{glass\ solder}$:

ii.   $CTE_{glass\ solder} \leq CTE_{base}-4$, in particular $CTE_{glass\ solder} \leq CTE_{base}-8$.

In the stress measurement sensor the material of the base may be a steel, particularly, an austenitic steel or a duplex steel.

According to a further aspect of the invention, this object is also achieved by a method for forming a stress measurement sensor having a sensor element that operates according to the SAW principle, which method comprises the following steps:
 a. provision of a base composed of a base material;
 b. provision of a sensor element operating according to the SAW principle, and having a carrier crystal;
 c. provision of a glass solder;
 d. connecting the base to the carrier crystal by means of interlayering, fusing and subsequent solidifying of the glass solder.

Further embodiments of the method according to the invention include a method characterized in that the combination comprising the base material, sensor element with carrier crystal and glass solder is selected in such a way that the following relations apply to the thermal expansion coefficients of these materials, thus the thermal expansion coefficients of the base material $CTE_{base}$, the thermal expansion coefficients of the carrier crystal $CTE_{SAW}$ and the thermal expansion coefficients of the glass solder $CTE_{glass\ solder}$:

i.   $CTE_{SAW}-3 \leq CTE_{base} \leq CTE_{SAW}+7$, ii.   $CTE_{glass\ solder} \leq CTE_{base}-2$, wherein the unit for the values for the thermal expansion coefficients is given in ppm/K.

Furthermore, the method is characterized in that the combination comprising the base material, sensor element with carrier crystal and glass solder is selected in such a way that the following relation is maintained for the thermal expansion coefficients of the base material $CTE_{base}$ and the thermal expansion coefficients of the carrier crystal of the sensor element that operates according to the SAW principle $CTE_{SAW}$:

i.   $CTE_{SAW}-1 \leq CTE_{base} \leq CTE_{SAW}+5$, wherein the unit for the values for the thermal expansion coefficients is given in ppm/K.

Still further, the method is characterized in that the combination comprising the base material, sensor element with carrier crystal, and glass solder is selected in such a way that the following relation is maintained for the thermal expansion coefficients $CTE_{base}$ of the base material and $CTE_{glass\ solder}$ of the glass solder:

ii.   $CTE_{glass\ solder} \leq CTE_{base}-4$, in particular $CTE_{glass\ solder} \leq CTE_{base}-8$.

Still further, the method is characterized in that a steel, in particular an austenitic steel or a duplex steel is selected for the material of the base. Finally, the maximum process temperature is selected for the fusing of the glass solder that is ≤500° C., in particular in the range between 300° C. and 500° C. Essential to the invention here is the selection of a glass solder as the joining material.

A glass solder is understood to be a glass having an especially low softening temperature, which is typically used to connect objects made out of glass, and as an insulating material in the implementation of electrical conductors by means of metal housings. The main components of typical glass solders are boron and lead oxide. A known manufacturer of glass solders, Schott AG in Landshut, Germany, specifies the following main classes in terms of classes of glass solders (wherein this does not necessarily include all possible glass solders): borosilicate glasses, alkali aluminosilicate glasses, alkali lead silicate glasses, alkali alkaline earth silicate glasses.

The softening temperatures of glass solder are 400° C. for example, and therefore fall below those of glass, which typically has softening temperatures in the range of 600 to 1000° C. Glass solders are processed at temperatures that fall between 350° C. and 700° C., depending on their type and composition.

The use of glass solder as a joining material has the advantage of a higher temperature resistance; it exhibits no significant signs of aging, it exhibits a substantially rigid behavior in terms of the transfer of material stresses or deformations through the base to the sensor element connected to the glass solder, and is chemically inert, and therefore exhibits none of the outgassing or other secretions, which may potentially distort the measured values of the sensor element based on the SAW principle. In particular, there is no concern that hysteresis effects on the measuring behavior of the sensor element that is connected to the base by means of glass solder will arise thereby, as can be observed in organic adhesive compounds containing resins. These exceptionally advantageous properties are founded on the chemical composition of the glass solder, which is characterized by a complete cross-linking, to the greatest extent possible with inert chemical bonding conditions, such as are typical in ceramics, for example, while organic joining agents consist of molecules, which are not completely cross-linked with one another, and which also comprise relatively weak organic bonds.

In addition, the use of glass solder as a joining material opens up the possibility of a manufacturing process, which, when compared to those that make uses of organic adhesives, is significantly simplified, since in particular, those processes are less time-critical. This is because when organic adhesives are used, chemical processes occur that are time-limited, which elicits a time-critical moment. When glass solder is used on the other hand, the physical softening and hardening of the solder is not time-critical.

When conducting trials with different material combinations of different starting materials for the base, for the sensor element, more precisely for the carrier crystal thereof, thus for what is typically a piezoelectric crystal, and for the glass solder, the inventors have determined that it is not possible to obtain good results in terms of the joint stability and sensory properties with just any combination of possible materials for the components. In the case of some combinations of different materials for the aforementioned components, no usable stress measurement sensors using the glass solder as a joining material could be produced. In analyzing the different measurement results, the inventors determined that a key feature for an especially good result is the ratio of the thermal expansion coefficients of the material involved. This applies in particular to achieving a joining layer, which determines the functionality and accuracy of the stress measurement sensor, which layer is stable and which reliably transmits deformations, or stresses, respectively, which are to be determined by the sensor element, said deformations or stresses arising between these two elements in the base in the course of the measurements. During these experiments, the inventors also determined that a compressive stress in the layer of joining material formed by the glass solder during the joining process produced the best and most reliable results in stress measurement sensors formed in this manner. The basic conditions therefor were recognized to be:

According to a first essential condition, the thermal expansion coefficient of the material of the base may not differ significantly from the thermal expansion coefficient of the material of the carrier crystal of the sensor element. In this case, limiting values of this first relation have been proven to create suitable conditions, for which the following applies, $CTE_{SAW}-3 \leq CTE_{base} \leq CTE_{SAW}+7$, wherein $CTE_{SAW}$ represents the thermal expansion coefficient of the carrier crystal, $CTE_{base}$ represents the thermal expansion coefficient of the material of the base and the unit for the values for the expansion coefficients in this relation is given in ppm/K.

A second essential condition is that the thermal expansion coefficient of the glass solder used must be less than that of the material of the base by a minimum amount. Here, the inventors have determined that the following relation is suitable: $CTE_{glass\ solder} \leq CTE_{base}-2$, wherein $CTE_{glass\ solder}$ is the thermal expansion coefficient of the glass solder, $CTE_{base}$ is the thermal expansion coefficient of the material of the base, and the units for the values of the thermal expansion coefficients are given in ppm/K.

Thermal expansion coefficients are values that are not only a function of the respective material, but as a rule, the value of those coefficients is also a function of the temperature itself. The thermal expansion coefficients of the carrier crystal ($CTE_{SAW}$), of the glass solder ($CTE_{glass\ solder}$) and of the material of the base ($CTE_{base}$) that are used here as a basis must therefore be regarded as average values for a predetermined range of temperatures. To this end, a range of temperatures for room temperature (assumed here to be (20° C.) and a temperature below the typical transformation temperatures for the glass solder that is involved (assumed here to be 300° C.) is taken into account, by means of which, a typical arithmetic averaging is performed. The determination of the thermal expansion coefficient of the glass solder $CTE_{glass\ solder}$ is thereby averaged over a range of temperatures according to the standard that is relevant thereto, ISO 7991. Here, values from the range between 20° C. and 300° C. are used as a basis for the value $CTE_{glass\ solder}$. Where no value is specified, an average value of the values in the range of temperatures 20° C. to 250° C. is likewise used. The latter is straightforward, since the thermal expansion coefficients, all the way up to the higher temperatures, do not initially change to a significant degree. Thus these values for a typical glass solder from Schott AG, according to the manufacturer's specifications, the glass solder having the glass number G018-256, scarcely differs, having an average value of 9.2 ppm/K for a range of temperatures from 20° C. to 250° C., and of 9.6 ppm/K for a range of temperatures from 20° C. to 300° C. In this regard, other, slightly deviating boundaries of the range of temperatures on which the calculation of the average is based may also be selected. The lower boundary, which is to be set at room temperature, may also vary, with 25° C. being assumed for example.

If the value of the thermal expansion coefficient is also a function of the direction (the direction of a selected crystal axis) under consideration (for example, due to anisotropy of the material), as may occur in certain materials, and, in particular, which is regularly the case in the material of the carrier crystal of the SAW, a value will be taken as a basis for the purposes of the invention, which will be determined as a function of the dimensions of the component. If this component has a significantly different extension along the linearly independent direction of the edge of a plane that runs parallel to the measuring surface of the SAW (in particular a ratio of 2:1 or more), the thermal expansion coefficient is taken into consideration, which applies to the direction of the longer extension. If the edge lengths are similar in scale (thus for example, in a ratio of 1:1.5 or less), an average value is taken for the thermal expansion coefficients that apply to the two directions.

In the case of such sample experiments, for which the material combinations fail to fulfill the above specified conditions, further investigation revealed that the joints had insufficient shear resistance. Having insufficient shear resistance, stress measurement sensors manufactured in such a way were no longer suited for practical use, at least not in the required scope. In particularly extreme cases, cracks were already visible in the glass solder after completing the joining processes, which result in a non-reproducible measurement characteristic of the sensor.

With respect to the second condition mentioned above, the difference of 2 ppm/K, at which the thermal expansion coefficient of the glass solder should be lower than that of the material of the base, is a minimum value. The inventors were unable to determine a maximum value with respect to these conditions, thus, material combinations were also examined in which this difference was up to 10 ppm/K, and which nonetheless produced very good results with very precise and resilient stress measurement sensors. Rather, it is the case that, with larger differences in the thermal expansion coefficients $CTE_{glass\ solder}$ and $CTE_{base}$, it was possible to obtain even better results, in particular greater shear resistance, so that there was an even better result when the relation $CTE_{glass\ solder} \leq CTE_{base}-4$ or even $CTE_{glass\ solder} \leq CTE_{base}-8$ was maintained.

On the other hand, the inventors determined that when the difference between the thermal expansion coefficients of the carrier crystal and the thermal expansion coefficient of the material of the base is further reduced, improved results could be achieved in terms of the quality of the stress measurement sensors thus formed. Even if good results could be achieved by means of the conditions specified above $CTE_{SAW}-3 \leq CTE_{base} \leq CTE_{SAW}+7$ with respect to this relation, a more narrowly defined field was favored in an advantageous embodiment of the invention, with the relation: $CTE_{SAW}-1 \leq CTE_{base} \leq CTE_{SAW}+5$, Wherein, again, the unit for the values for the thermal expansion coefficients is to be given in ppm/K.

Steel is preferable as the material for the base, not least because corresponding stress measurement sensors frequently must be applied to metals, but also because this material is especially robust for use in the manufacturing of the base, exhibits a good transmission of arising stresses, and also good durability in the joining thereof to the glass solder. In addition to other advantages, steel also offers the advantage that a base composed of this material may provide the opportunity to apply the stress sensor to the device under test, since this object is frequently also produced from stainless steel, as is the case for example in machine elements. In various experiments, the inventors tested different stainless steel with various material combinations in the glass solders and in the carrier crystals for the sensor element, and thereby discovered that, in particular, austenitic steels and duplex steels were especially suitable for use as the material for the base. The results produced by ferritic and martensitic steels were clearly less favorable, and thus not preferred.

With respect to the aspect of the method proposed in order to achieve the object of the invention, a method for forming a stress measurement sensor having a sensor element that operates according to the SAW principle is suggested, which has at least the following steps:

a. the provision of a base composed of a base material;
b. the provision of a sensor element operating according to the SAW principle, and having a carrier crystal;
c. the provision of a glass solder;
d. the connection of the base to the carrier crystal by means of interlayering, fusing and subsequent solidifying of the glass solder.

The term "interlayering" as is used in step d, is used here in a broad sense. Thus the glass solder may be used in a solid state as a so-called preform, and may be placed between the components. It may also be applied as a suspension, however, or may be imprinted onto the base and/or the carrier crystal. This kind of application is also understood as "interlayering" within the meaning of the invention.

In this way, a stress measurement sensor is obtained as a result, which has a glass solder as a joining material, having all of the advantages described above. With respect to the method, it also applies that it is especially advantageous for the material's base material, carrier crystal of the sensor element, and glass solder to be selected such that the aforementioned criteria and relations are fulfilled. The benefits described above thereby arise as a result. In the case of the method according to the invention, the selection of the material for the base may also be steel, in this case an austenitic steel or a duplex steel in particular. The advantages already mentioned above also apply to this choice.

A maximum process temperature is advantageously selected for the fusing of the glass solder that is 500° C. or less, in particular in the range between 300° C. and 500° C. for the creating the joint by means of fusing and subsequent solidifying of the glass solder. Tests have shown that process temperatures selected during this process step that exceed 500° C. may result in damage to the surface structure of the sensor element and thereby to an impairment, or even failure, of the sensor function of the sensor element operating according to the SAW principle. Thus in making a selection, it is ultimately preferable that the choice of glass solder be determined in such a way that that solder can be processed at temperatures that correspond to the above mentioned process temperatures in order to form a strong and durable joint.

BRIEF DESCRIPTION OF THE DRAWINGS

Additional advantages and features will become apparent from the following description of embodiments with reference to the accompanying figures.

DETAILED DESCRIPTION

Figure 1:
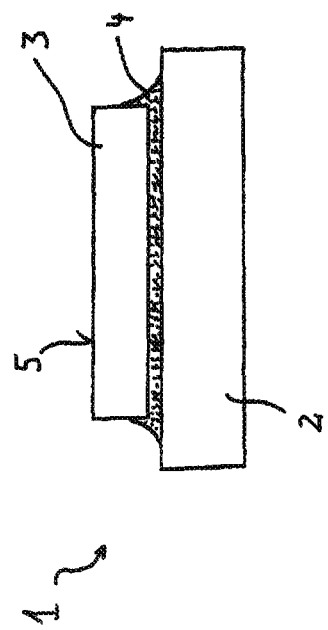
FIG. 1 shows a schematic representation of the basic design of a stress measurement sensor according to the invention.

FIG. 1 shows a schematic representation of an embodiment of a stress measurement sensor 1 according to the invention. This sensor includes a base 2 and a sensor element 3, which is fixed on the base 2. The sensor element 3 operates according to the SAW principle. For this reason, a sensor surface 5 is thereby provided, disposed opposite the base 2, which surface has corresponding, well-known patterns, not shown here, wherein surface acoustic waves, the characteristics of which are evaluated for the measurement, extend along said sensor surface. The body of the sensor element 3 is formed from a piezoelectric carrier crystal. "Carrier crystal" is therefore not understood to be a pure crystalline material, but may also be a (partially) amorphous material, such as a ceramic.

The sensor element 3 is fixed to the base 2 by means of a joining material 4, and fastened thereto. Mechanical tensions or stresses exerted on the sensor element 3 are transmitted to the base 2 by means of the joining material 4, and there, lead to changes in the running or propagation characteristics of the surface acoustic waves, which are recorded and evaluated as a measurement result for the determination of the applied mechanical stresses. In this respect, in this general design, the illustrated stress measurement sensor 1 is already known from the prior art. What is special in the stress measurement sensor 1 of the invention is that the joining material 4 is a glass solder. This solder leads to a very strong and temperature-resistant connection of the sensor elements 3 to the base 2. The solder is chemically inert, undergoes no offgassing and thus no measurement errors will occur as a result of the condensation of chemical compounds or elements on the sensor surface 5, which stem from such offgassing. A stress measurement sensor 1 formed thus, having a glass solder as a joining material 4, exhibits no hysteresis behavior in the measurement characteristic.

A base 2, a sensor element 3, and a glass solder as a joining material 4 are provided in order to form the stress measurement sensor 1. The glass solder, which is rigid at low temperatures, is interlayered between the base 2 and the sensor element 3, or applied in the region, respectively, and the arrangement is subsequently heated to a maximum process temperature of 400° C. for example. In so doing, the glass solder flows and forms a joint between the base 2 and the sensor element 3, in a manner similar to a welding procedure to connect metals by means of a welding metal. The glass solder hardens during subsequent cooling below the transformation temperature, for example at 300° C., and the joint between the base 2 and the sensor element 3 becomes fixed.

As shown in FIG. 1, the base 2 may be a separate element, wherein the stress measurement sensor 1 may be disposed by means of a fixed connection (joining) of the base 2 to an object that is to be measured or monitored. Alternatively however, the base itself, may also be a surface of the object that is to be measured to monitored, and the sensor element 3 may be applied directly to this surface by means of a glass solder as a joining material 4. In particular, this may occur, where objects that are to be measured or monitored are sufficiently small and can already easily be equipped with a sensor element 3 in a known manner during production.

In a series of tests, the inventors found that in order to form reliably functioning stress measurement sensors with respect to the thermal expansion coefficients of the elements involved, it is advantageous that the following parameters be observed:

$$CTE_{SAW}-3 \leq CTE_{base} \leq CTE_{SAW}+7, \quad \text{i)}$$

$$CTE_{glass\ solder} \leq CTE_{base}-2, \quad \text{ii)}$$

wherein $CTE_{SAW}$ represents the thermal expansion coefficient of the carrier crystal of the sensor element 3 that operates according to the SAW principle, $CTE_{base}$ represents the thermal expansion coefficient of the base material and $CTE_{glass\ solder}$ represents the thermal expansion coefficient of the glass solder, and the unit for the values for the thermal expansion coefficients is given in ppm/K. The value of the respective thermal expansion coefficient to be taken into consideration is determined and established according to the criteria already described above for averaging over a range of range of temperatures, and criteria for averaging that is to be performed in order to determine the relevant direction or for determining a deviation in reference to this direction.

With respect to the first condition specified above, an even more narrow limit where $$CTE_{SAW}-1 \leq CTE_{base} \leq CTE_{SAW}+5, \quad \text{i)}$$

has proven to be especially preferable.

In addition (and this is independent of the limit in relation i), better results were obtained when the relation of condition ii) was made even more restrictive $$CTE_{glass\ solder} \leq CTE_{base}-4, \quad \text{ii)}$$

or even $$CTE_{glass\ solder} \leq CTE_{base}-8. \quad \text{ii)}$$

Steel is preferably selected as a material for the base 2, wherein austenitic steels and duplex steels have proven to be especially suitable.

In comparison experiments, the inventors used carrier crystals for the sensor element 3 that was based on the SAW principle, which crystals were composed of quartz having different cutting planes for the sensor surface 5. This material possesses different thermal expansion coefficients ($CTE_{SAW}$) in the direction of different crystal axes. An elongated element having a longitudinal direction, i.e., a direction in which the sensor element had a significantly greater longitudinal extension that in the direction transverse thereto, was cut from this carrier crystal of the sensor element 3, along which a crystal axis lay, in which direction the thermal expansion coefficient $CTE_{SAW}$ was approximately 15±1 ppm/K. In a direction transverse thereto (thus in the direction of the shorter edge length of the sensor element) and as a function of the cut, on the other hand, the thermal expansion coefficient was 12±2 ppm/K (since this direction did not lie along a crystal axis, but rather, along the direction containing components of both crystal axes that were weighted approximately equally, an average value of the two values applicable in the direction of the crystal axis was used).

In particular, a quartz crystal having a sensor surface along a cutting plane, 36° redYX or pursuant to IEEE: (YXl) 36° was used.

Different steels were used as a material for the base 2 in the comparison experiments. In so doing, stainless steels from various subgroups were examined. The values for thermal expansion coefficients $CTE_{base}$ of ferritic and martensitic steels fell in the range of approximately 10.5 to 11.5 ppm/K. A typical representative of such a steel is ferritic steel 1.4016.

Duplex-steels (ferritic-austenitic steels) have thermal expansion coefficients $CTE_{base}$ of approximately 14 ppm/K. Here, the steel 1.4462 is a typical representative.

Austenitic steels have a thermal expansion coefficient $CTE_{base}$ of approximately 17 ppm/K. Here, the steel 1.4301 is a typical representative.

The tests were conducted with different glass solders. In so doing, it was found that it is only useful if glass solders are used that have a lower thermal expansion coefficient $CTE_{glass\ solder}$ than the thermal expansion coefficient $CTE_{base}$ of the steel that is being used.

Temperatures that exceed approximately 500° C. result in damage to the sensor element 3 that is based on the SAW principle, and therefore cannot be used. Therefore, such glass solders were used that have a corresponding processing temperature that falls below 500° C. These are glass solders from the manufacturer, Schott AG for example, as listed with their thermal expansion coefficients in the following Table 1.

TABLE 1

| Glass solder designation | $CTE_{glass\ solder}$ in ppm/K |
|---|---|
| Schott G018-228 | 7.6* |
| Schott G018-256 | 9.6* |
| Schott 8472 | 12** |

*Manufacturer's specifications according to the data sheet; expansion coefficient averaged over a range of temperatures from 20° C. (room temperature) to 300° C. according to ISO 7991.
**Manufacturer's specifications according to the data sheet; expansion coefficient averaged over a range of temperatures from 20° C. (room temperature) to 250° C. according to ISO 7991.

In the experiments for combining the elements, it was first assessed whether the desired joint that was created was flawless according to a visual analysis (open visual analysis and enlarged under a magnifying glass and microscope). This includes verifying that the glass solder and the carrier crystal of the sensor element 3 that operates according to the SAW principle are free of cracks and undamaged.

In addition, the shearing force, at which the joint between the base 2 and the sensor element 3 failed, was measured on the different stress measurement sensors. It was possible to calculate the shear resistance in MPa, by dividing the force by the sheared surface (in the experiments that were carried out, 4 mm²).

The results of the comparison experiments showed the following:

No satisfactory results were obtained for ferritic or martensitic steels, respectively, having thermal expansion coefficients $CTE_{base}$ or approximately 11 ppm/K, as expressed in an average value across a range from room temperature (20° C.) to 300° C. The glass solder joints are either already completely cracked during the cooling process, subsequently exhibit damage in the form of cracks in the joint layer, or achieved insufficient shearing resistance.

With duplex steels ($CTE_{base}$ von ca. 14 ppm/K, as expressed in an average value across a range from room temperature (20° C.) to 300° C.), it was possible to obtain good results in conjunction with a glass solder having a thermal expansion coefficient $CTE_{glass\ solder}$ of less than 8 ppm/K. Here, the thermal expansion coefficient $CTE_{glass\ solder}$ of the glass solder selected must also be at least 6 ppm/K lower than the thermal expansion coefficient $CTE_{base}$ of the steel. That coefficient is also significantly lower than the thermal expansion coefficient $CTE_{SAW}$, which the carrier crystal of the sensor element operating according to the SAW principle exhibits here in the aforementioned longitudinal direction.

In the case of austenitic steels ($CTE_{base}$ of approximately 17 ppm/K, as expressed in an average value across a range from room temperature (20° C.) to 300° C.), good results were obtained with glass solders having thermal expansion coefficients $CTE_{glass\ solder}$ between 10 and 12 ppm/K. Here, the difference from the thermal expansion coefficient $CTE_{base}$ of the steel is 5-7 ppm/K. The best results were obtained with those glass solders, the thermal expansion coefficient $CTE_{glass\ solder}$ of which was lower than 10 ppm/K. Such glass solder joints withstood an extension of the steel substrate, thus of the base 2, of more than 1,000 ppm in the tensile test.

Figure 2:
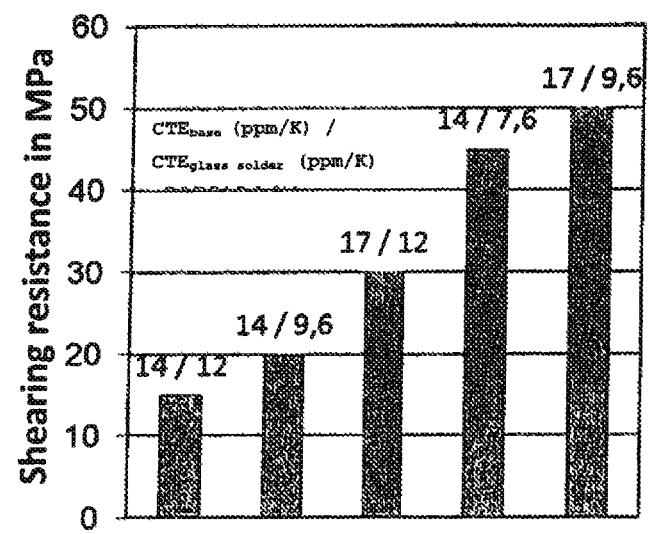
FIG. 2 is a graph showing the results of the shearing resistance determinations for different combinations of steel in the base and glass solder for the connection of a given sensor element to a quartz crystal as a carrier crystal.

Results of the shearing resistance determinations for different combinations of steel in the base and glass solder for the connection of a given sensor element to a quartz crystal as a carrier crystal are presented in FIG. 2. Only those measurement sensors, which proved to be flawless in a visual analysis, and which were without cracks, were taken into consideration in the analysis presented in the graph:

The following may also be concluded here from the results: for the glass soldering of sensor element 3 having a carrier crystal composed of quartz (there were several different quartz cuts that were successfully soldered), steels should be used for the base 2, which have a thermal expansion coefficient $CTE_{base}$ between 13 and 18 ppm/K, preferably between 14 and 17 ppm/K. These glass solder should have a thermal expansion coefficient $CTE_{glass\ solder}$, which is approximately 2 to 10 ppm/K lower than the thermal expansion coefficient $CTE_{base}$ of the steel, preferably approximately 4 to 8 ppm/K lower.

In addition to quartz as a material for the carrier crystal of the SAW, other known suitable materials may be used for this application, in particular lithium niobate ($LiNbO_3$) and lithium tantalate ($LiTaO_3$). The inventors have stressed that these materials may also be applied to a base with glass solder with excellent results and that, even there, the same considerations with regard to the preferred relations of the thermal expansion coefficients $CTE_{base}$, $CTE_{glass\ solder}$ and $CTE_{SAW}$ still apply.

The following applies to the thermal expansion coefficients of the carrier crystal in a quantity averaged over the already specified range of temperatures (for the different directions of the crystal axes:

TABLE 2

| Crystal | α11 in ppm/K | α33 in ppm/K |
|---|---|---|
| Quartz | 15.3 | 8.6 |
| $LiNbO_3$ | 16.5 | 4.5 |
| $LiTaO_3$ | 17.5 | 3.5 |

The values for the expansion coefficients, and the average values thereof that apply over the specified temperature intervals, can be found in the literature regarding the materials in question. The relevant specifications for the base materials, such as steels, as well as for the glass solders, are typically found in the respective manufacturer's data sheets. As already noted above, when a relevant edge direction of the sensor element 3 does not lie along a crystal axis, but rather is in a mixed direction, this in a direction having components of the direction of crystal axes, the person skilled in the art will then make a suitable approximate calculation or estimation respectively for the thermal expansion coefficients in this direction, for example, a formation of a mean value or an approximation of another weighting when the components of the direction of the crystal axis are represented to different degrees in the mixed direction.

Specifications regarding the thermal expansion coefficients of possible carrier crystals of the SAW in reference to quartz, lithium tantalate and lithium niobate can be found in the publication, "The Temperature Coefficients of Acoustic Surface Wave Velocity and Delay on Lithium Niobate, Lithium Tantalate, Quartz and Tellurium Dioxideil" by Andrew J. Slobodnik Jr. in Physical Science Research Papers No. 477, Air Force Cambridge Research Laboratories, Dec. 22, 1977. Data regarding lithium niobate can also be found in the book, "Properties of Lithium Niobate 11", Publisher: K. K. Wong, INSPEC, The Institute of Electrical Engineers, London 2002. Values for quartz can also be found, for example in FIG. 5 of the published patent application, US 2011/0241492 A 1.

REFERENCE CHARACTERS 1 stress measurement sensor
2 base
3 sensor element
4 joining material
5 sensor surface

The invention claimed is:

1. A stress measurement sensor provided with a sensor element that operates according to the SAW principle, comprising a base composed of a first material, and the sensor element, which is fixed to the base with a joining material, wherein the joining material is a glass solder, and wherein the material combination comprising the first material of the base, the glass solder and a carrier crystal of the sensor element is selected in such a way that the following relationships apply to the thermal expansion coefficients of the materials involved, namely the thermal expansion coefficient of the first material of the base $CTE_{base}$, the thermal expansion coefficient of the glass solder $CTE_{glass\ solder}$ and the thermal expansion coefficients of the carrier crystal of the sensor element that operates according to the SAW principle $CTE_{SAW}$:

$$CTE_{SAW}-3 \leq CTE_{base} \leq CTE_{SAW}+7 \qquad \text{i.;}$$

$$CTE_{glass\ solder} \leq CTE_{base}-2 \qquad \text{ii.;}$$

wherein the unit for the values for the thermal expansion coefficients is given in ppm/K.

2. The stress mesurement sensor according to claim 1, wherein the following relationship applies to the thermal expansion coefficients of the first material of the base and the thermal expansion coefficients of the carrier crystal of the sensor element that operates according to the SAW principle $CTE_{SAW}$:

$$CTE_{SAW}-1 \leq CTE_{base} \leq CTE_{SAW}+5 \qquad \text{i.;}$$

wherein the unit for the values for the thermal expansion coefficients is given in ppm/K.

3. The stress measurement sensor according to claim 1, wherein the following relationship applies to the thermal expansion coefficients of the first material of the base, $CTE_{base}$, and the thermal expansion coefficients of the glass solder, $CTE_{glass\ solder}$:

$$CTE_{glass\ solder} \leq CTE_{base}-4 \qquad \text{ii.}$$

4. The stress measurement sensor according to claim 1, wherein the first material of the base is a steel.

5. The stress measurement sensor according to claim 4, wherein the first material of the base is an austenitic steel or a duplex steel.

6. A method for forming a stress measurement sensor having a sensor element that operates according to the SAW principle, which method comprises the following steps:
   a. provision of a base composed of a base material;
   b. provision of a sensor element operating according to the SAW principle, and having a carrier crystal;
   c. provision of a glass solder;
   d. connecting the base to the carrier crystal by means of interlayerinq, fusing and subsequent solidifying of the glass solder; and wherein the combination comprising the base material, sensor element with carrier crystal and glass solder is selected in such a way that the following relationships apply to the thermal expansion coefficients of these materials, thus the thermal expansion coefficients of the base material $CTE_{base}$, the thermal expansion coefficients of the carrier crystal $CTE_{SAW}$ and the thermal expansion coefficients of the glass solder $CTE_{glass\ solder}$:

$$CTE_{SAW}-3 \leq CTE_{base} \leq CTE_{SAW}+7 \qquad \text{i.;}$$

$$CTE_{glass\ solder} \leq CTE_{base}-2 \qquad \text{ii.;}$$

wherein the unit for the values for the thermal expansion coefficients is given in ppm/K.

7. The method according to claim 6, wherein the combination comprising the base material, sensor element with carrier crystal and glass solder is selected in such a way that the following relationship is maintained for the thermal expansion coefficients of the base material $CTE_{base}$ and the thermal expansion coefficients of the carrier crystal of the sensor element that operates according to the SAW principle $CTE_{SAW}$:

$$CTE_{SAW}-1 \leq CTE_{base} \leq CTE_{SAW}+5 \qquad \text{i.;}$$

wherein the unit for the values for the thermal expansion coefficients is given in ppm/K.

8. The method according to claim 6, wherein the combination comprising the base material, sensor element with carrier crystal, and glass solder is selected in such a way that the following relationship is maintained for the thermal expansion coefficients $CTE_{base}$ of the base material and $CTE_{glass\ solder}$ of the glass solder:

$$CTE_{glass\ solder} \leq CTE_{base}-4 \qquad \text{ii.}$$

9. The method according to claim 6, wherein a steel is selected for the base material.

10. The method according to claim 6, wherein a maximum process temperature is selected for the fusing of the glass solder that is $\leq 500°$ C.

11. The stress measurement sensor according to claim 3, wherein the following relationship applies to the thermal expansion coefficients of the first material of the base, $CTE_{base}$, and the thermal expansion coefficients of the glass solder, $CTE_{glass\ solder}$:

$$CTE_{glass\ solder} \leq CTE_{base}-8 \qquad \text{ii.}$$

12. The method according to claim 8, wherein the following relationship is maintained for the thermal expansion coefficients $CTE_{base}$ of the base material and $CTE_{glass\ solder}$ of the glass solder:

$$CTE_{glass\ solder} \leq CTE_{base}-8 \qquad \text{ii.}$$

13. The method according to claim 9, wherein the steel is an austenitic steel or a duplex steel.

14. The method according to claim 10, wherein the maximum process temperature is in from about 300° C. up to about 500° C.

15. The stress measurement sensor according to claim 1, wherein a first face of the base is secured to a first face of the sensor element by a band of the glass solder, and the band of glass solder is substantially solid and free of any gaps.

* * * * *

UNITED STATES PATENT AND TRADEMARK OFFICE
CERTIFICATE OF CORRECTION

PATENT NO.        : 9,207,132 B2
APPLICATION NO.   : 14/245335
DATED             : December 8, 2015
INVENTOR(S)       : Helbig et al.

It is certified that error appears in the above-identified patent and that said Letters Patent is hereby corrected as shown below:

In the claims

Column 12, line 49 (Claim 2) Change "mesurement" to --measurement--.

Signed and Sealed this
First Day of March, 2016

Michelle K. Lee
*Director of the United States Patent and Trademark Office*